United States Patent
Chen et al.

(10) Patent No.: US 6,426,283 B1
(45) Date of Patent: Jul. 30, 2002

(54) METHOD FOR BUMPING AND BACKLAPPING A SEMICONDUCTOR WAFER

(75) Inventors: Yen-Ming Chen, Hsin Chu; Kuo-Wei Lin; Cheng-Yu Chu, both of Hsinchu; Fu-Jier Fan; Yang-Tung Fan, both of Jubei; Chiou-Shian Peng, Hsin-Chu; Shih-Jane Lin, Hsinchu, all of (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 33 days.

(21) Appl. No.: 09/727,832

(22) Filed: Dec. 1, 2000

(51) Int. Cl.⁷ ............................................. H01L 21/44
(52) U.S. Cl. ...................... 438/613; 438/612; 438/125
(58) Field of Search .............................. 438/613, 125, 438/612, 928, 977

(56) References Cited

U.S. PATENT DOCUMENTS

| | | | |
|---|---|---|---|
| 5,854,085 A | * 12/1998 | Raab et al. | 437/211 |
| 5,924,003 A | * 7/1999 | Slocum | 438/612 |
| 6,083,837 A | * 7/2000 | Millet | 438/691 |
| 6,214,642 B1 | * 4/2001 | Chen et al. | 438/108 |
| 6,294,439 B1 | * 9/2001 | Sasaki et al. | 438/464 |
| 6,337,258 B1 | * 1/2002 | Najkayoshi et al. | 438/464 |

* cited by examiner

*Primary Examiner*—Alexander G. Ghyka
(74) *Attorney, Agent, or Firm*—Randy W. Tung

(57) ABSTRACT

A method for bumping and backlapping a semiconductor wafer that has a multiplicity of solder bumps formed on an active surface of the wafer is disclosed. In the method, a preprocessed wafer that has a multiplicity of bond pads formed on a top surface is first provided, a under-bump-metallurgy (UBM) layer is then sputter deposited on top of the wafer surface, followed by the lamination of a dry film resist layer on top of the UBM layer. The dry film resist layer is then patterned with a multiplicity of openings exposing the multiplicity of bond pads, followed by the deposition of a solder material into the multiplicity of openings to form the solder bump's. A protective tape is then adhesively bonded to the top of the dry film resist layer before the wafer is positioned into a backlapping apparatus for removing of a preselected thickness from the backside of the wafer. After the completion of the backside lapping process, the protective tape and the dry film resist layer are stripped away sequentially and the solder bumps are reflown into solder balls. The present invention novel method effectively prevents any damages to. the solder balls during the backlapping process since the solder bumps are well protected by the dry film resist layer during such process.

18 Claims, 4 Drawing Sheets

METHOD FOR BUMPING AND BACKLAPPING A SEMICONDUCTOR WAFER

FIELD OF THE INVENTION

The present invention generally relates to a method for bumping and backlapping a semiconductor wafer and more particularly, relates to a method for backlapping a semiconductor wafer that has solder bumps formed on an active surface without damaging the bumps in a backlapping process.

BACKGROUND OF THE INVENTION

In the fabrication of modern semiconductor devices, the ever increasing device density and decreasing device dimensions demand more stringent requirements in the packaging or interconnecting techniques in such high density devices. Conventionally, a flip-chip attachment method has been used in packaging of semiconductor chips. In the flip-chip attachment method, instead of attaching a semiconductor die to a lead frame in a package, an array of solder bumps is formed on the surface of the die. The formation of the solder bumps may be carried out in an evaporation method by using a composite material of tin and lead through a mask for producing a desired pattern of solder bumps. The technique of electrodeposition has been more recently developed to produce solder bumps in flip-chip packaging process.

Other techniques that are capable of solder-bumping a variety of substrates to form solder balls have also been proposed. The techniques generally work well in bumping semiconductor substrates that contain solder structures over a minimal size. For instance, one of such widely used techniques is a solder paste screening method which has been used to cover the entire area of an eight inch wafer. However, with recent trend in the miniaturization of device dimensions and the necessary reduction in bump-to-bump spacing (or pitch), the use of the solder paste screening technique has become more difficult.

Other techniques for forming solder bumps such as the controlled collapse chip connection (C4) technique and the thin film electrodeposition technique have also been used in recent years in the semiconductor fabrication industry. The C4 technique is generally limited by the resolution achievable by a molybdenum mask which is necessary for the process. Fine-pitched solder bumps are therefore difficult to be fabricated by the C4 technique. Similarly, thin film electrodeposition techniques require a ball limiting metallurgy layer to be deposited and defined by an etching process which has the same limitations as the C4 technique. For instance, a conventional thin film electrodeposition process for depositing solder bumps is shown in FIGS. 1A~1F.

A conventional semiconductor structure 10 is shown in FIG. 1A. The semiconductor structure 10 is built on a silicon substrate 12 with active devices built therein. A bond pad 14 is formed on a top surface 16 of the substrate 12 for making electrical connections to the outside circuits. The bond pad 14 is normally formed of a conductive metal such as aluminum. The bond pad 14 is passivated by a final passivation layer 20 with a window 22 opened by a photolithography process to allow electrical connection to be made to the bond pad 14. The passivation layer 20 may be formed of any one of various insulating materials such as oxide, nitride or organic materials. The passivation layer 20 is applied on top of the semiconductor device 10 to provide both planarization and physical protection of the circuits formed on the device 10.

Onto the top surface 24 of the passivation layer 20 and the exposed top surface 18 of the bond pad 14, is then deposited an under bump metallurgy layer 26. This is shown in FIG. 1B. The under bump metallurgy (UBM) layer 26 normally consists of an adhesion/diffusion barrier layer 30 and a wetting layer 28. The adhesion/diffusion barrier layer 30 may be formed of Ti, TiN or other metal such as Cr. The wetting layer 28 is normally formed of a Cu layer or a Ni layer. The UBM layer 26 improves bonding between a solder ball to be formed and the top surface 18 of the bond pad 14.

In the next step of the process, as shown in FIG. 1C, a photoresist layer 34 is deposited on top of the UBM layer 26 and then patterned to define a window opening 38 for the solder ball to be subsequently formed. In the following electrodeposition process, a solder ball 40 is electrodeposited into the window opening 38 forming a structure protruded from the top surface 42 of the photoresist layer 34. The use of the photoresist layer 34 must be carefully controlled such that its thickness is in the range between about 30 $\mu$m and about 40 $\mu$m, preferably at a thickness of about 35 $\mu$m. The reason for the tight control on the thickness of the photoresist layer 34 is that, for achieving a fine-pitched solder bump formation, a photoresist layer of a reasonably small thickness must be used to achieve a high imaging resolution. It is known that, during a photolithography process, the thicker the photoresist layer, the poorer is the imaging process. To maintain a reasonable accuracy in the imaging process on the photoresist layer 34, a reasonably thin photoresist layer 34 must be used which results in a mushroom configuration of the solder bump 40 deposited therein. The mushroom configuration of the solder bump 40 contributes greatly to the inability of a conventional process in producing fine-pitched solder bumps.

Referring now to FIG. 1E, wherein the conventional semiconductor structure 10 is shown with the photoresist layer 34 removed in a wet stripping process. The mushroom-shaped solder bump 40 remains while the under bump metallurgy layer 26 is also intact. In the next step of the process, as shown in FIG. 1F, the UBM layer 26 is etched away by using the solder bump 40 as a mask in an wet etching process. The solder bump 40 is then heated in a reflow process to form solder ball 42. The reflow process is conducted at a temperature that is at least the reflow temperature of the solder material.

After the solder balls are formed on the wafer surface for the flip chips, the wafer must be thinned in a backlapping process similar to that used in a non-flip chip device. The removal of the backside, or the inactive side, of the wafer is necessary not only to planarize the wafer backside, but also to reduce the thickness dimension of the IC chip fabricated.

A conventional backlapping process used for thinning a flip chip packaged wafer is shown in FIGS. 2A~2C. The backlapping process is conducted on semiconductor wafers in order to correct any curvature in the wafer and to achieve planarity and parallelism of the top and bottom surfaces of a wafer. Since a wafer polishing process can only remove a maximum thickness of about 5 $\mu$m, the polishing process cannot be used effectively to correct the curvature of the wafer and to achieve parallelism of the surfaces. The lapping, or backlapping process, is used before a wafer polishing process to achieve the major thickness reduction. The wafer lapping process can be carried out in a lapping apparatus which may be a single-side lapping or a double-side lapping.

When a conventional backlapping process is utilized in lapping the backside of a flip chip packaged wafer, as shown by structure 10 of FIG. 2A, numerous processing difficulties have been discovered. The conventional backlapping process requires the mounting of a protective tape 44 to the top of the active surface of the wafer, i.e. to the top of the solder balls 42, as shown in FIG. 2B. However, instead of a relatively planar top surface formed by bond pads covered by a passivation layer on a non-flip chip wafer, the protective tape 44 which is adhesively bonded to the top of the solder balls 42 does not adequately protect the solder balls 42 during a backlapping process. For instance, as shown in FIG. 2C, due to the high pressure necessary for mounting the protective tape 44 and the high pressure applied during lapping, even though the thickness of the substrate 12 is significantly reduced to a thickness 46, the solder balls 42 can fall off or be crushed during the lapping process.

A process flow chart for the conventional backlapping process that utilizes a protective tape is shown in FIG. 3. It is noted that in the conventional backlapping process 50, the UBM sputtering step 52, the dry film resist lamination step 54, the photoresist exposure/developing step 56, the solder electroplating step 58, the resist stripping step 60 and the solder reflow step 62 are substantially similar to that shown in FIGS. 1B~1F. The protective tape mounting step 64, the backside lapping step 66 and the demounting of the protective tape step 68 are substantially shown in FIGS. 2A~2C.

It is therefore an object of the present invention to provide a method for bumping and backlapping a semiconductor wafer that does not have the drawbacks or shortcomings of the conventional method when a protective tape is utilized.

It is another object of the present invention to provide a method for bumping and backlapping a semiconductor wafer without causing damages to the solder balls formed on the flip chip package.

It is a further object of the present invention to provide a method for bumping and backlapping a semiconductor wafer prior to a solder reflow process and prior to the formation of solder balls.

It is another further object of the present invention to provide a method for bumping and backlapping a semiconductor wafer wherein the backlapping process is conducted while solder bumps are protected by a photoresist layer.

It is still another object of the present invention to provide a method for bumping and backlapping a semiconductor wafer by mounting a protective tape on top of a dry film photoresist layer for protecting the solder bumps.

It is yet another object of the present invention to provide a method for bumping and backlapping a semiconductor wafer wherein a wafer backside thickness can be reduced by at least 40% of its original thickness without damaging the solder bumps.

It is still another further object of the present invention to provide a method for bumping and backlapping a semiconductor wafer wherein a backside of a wafer is first lapped before the solder bumps are reflown into solder balls.

SUMMARY OF THE INVENTION

In accordance with the present invention, a method for bumping and backlapping a semiconductor wafer that has flip chip packages formed on top without damaging the solder balls is provided.

In a preferred embodiment, a method for bumping and backlapping a semiconductor wafer can be carried out by the steps of first providing a pre-processed wafer that has a multiplicity of bond pads on a top surface; depositing a under-bump-metallurgy layer on the top surface of the wafer; laminating a dry film resist layer on top of the UBM layer; patterning the dry film resist layer with a multiplicity of openings exposing the multiplicity of bond pads; depositing a solder into the multiplicity of openings forming a multiplicity of solder bumps; mounting a protective tape on top of the dry film resist layer; and removing a preselected thickness from a bottom surface of the wafer.

The method for bumping and backlapping a semiconductor wafer may further include the step of reflowing the multiplicity of solder bumps to a multiplicity of solder balls after the removing step, or the step of mounting the protective tape on top of the dry film resist layer by adhesive means, or the step of providing the protective tape with an adhesive layer coated on one side. The method may further include the step of mounting the wafer in a backlapping apparatus with the protective tape facing downwardly and the bottom surface of the wafer exposed. The method may further include the step of removing at least 40% of the thickness of the wafer from the bottom surface of the wafer, or the step of stripping the protective tape and the dry film resist layer sequentially from the top surface of the wafer after the removing step. The method may further include the step of providing the protective tape in an insulating material, or the step of depositing solder into the multiplicity of openings by an electroplating technique or by a stencil printing technique.

The present invention is further directed to a method for backlapping a semiconductor wafer that has a multiplicity of solder bumps formed on an active surface which can be carried out by the operating steps of first providing a semiconductor wafer that has a multiplicity of solder bumps formed in a dry film photoresist layer; mounting a protective film to a top surface of the dry film photoresist layer with an inactive surface of the wafer exposed; and removing a preselected thickness from the inactive surface of the wafer in a lapping process.

The method for backlapping a semiconductor wafer that has a multiplicity of solder bumps formed on an active surface may further include the step of patterning the dry film photoresist layer with a multiplicity of openings exposing a multiplicity of bond pads prior to a solder filling step for forming the multiplicity of solder bumps, or the step of stripping the protective film from the top surface of the dry film photoresist layer after the removing step, or the step of stripping the protective film and the dry film resist layer sequentially from the active surface of the wafer.

The method for backlapping a semiconductor wafer may further include the step of removing at least 40% of the thickness of the wafer from the inactive surface of the wafer during the removing step, or the step of reflowing the multiplicity of solder bumps into a multiplicity of solder balls after the stripping step, or the step of removing a preselected thickness from the inactive surface of the wafer such that a final thickness of not more than 300 $\mu$m is obtained when the wafer is a 300 mm diameter wafer. The method may further include the step of removing the preselected thickness from the inactive surface of the wafer in a lapping process by utilizing a slurry solution.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a method for bumping and backlapping a semiconductor wafer that has a multiplicity of solder bumps formed on an active surface without causing damages to the solder bumps. After the backlapping process is conducted, the solder bumps are reflown into solder balls.

The method improves upon the conventional method by backlapping the wafer prior to the solder ball reflow process such that during the backlapping process, the solder bumps are well protected by a photoresist layer that was used for molding, or filling the solder bumps. The method utilizes a dry film resist layer that can be advantageously laminated to a wafer surface exposing a multiplicity of bond pads onto which solder balls are attached. A solder material is then filled into the multiplicity of openings to form the solder bumps by a stencil printing process or an electroplating process. Prior to the backlapping process being conducted, a protective tape is first adhesively bonded to the top of the resist layer for protecting the solder bumps. After the backside of the wafer is lapped, or removed by at least 40% of the total thickness of the wafer, the protective tape and the resist layer are stripped away so that solder bumps may be reflown in a reflow process into solder balls.

The present invention provides a superior solution to the solder ball damage problem frequently incurred in a flip chip backlapping process. While others have attempted other solutions such as backlapping before the bumping process, a serious drawback of wafer breakage frequently occurs during a subsequent solder bumping process due to the high stress imposed on the wafer. Moreover, the thickness of the wafer to be removed is limited for the same reason, i.e. a thin wafer cannot stand the bumping stress. Another frequently seen problem is that during the dry film lamination process, wafer breakage can occur due to the large force used for laminating the film to the wafer surface.

Figure 1A:
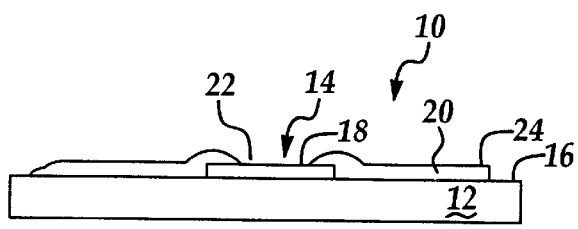
FIGS. 1A–1F are enlarged, cross-sectional views of a conventional process for forming a solder ball in a flip chip package.
Figure 1B:
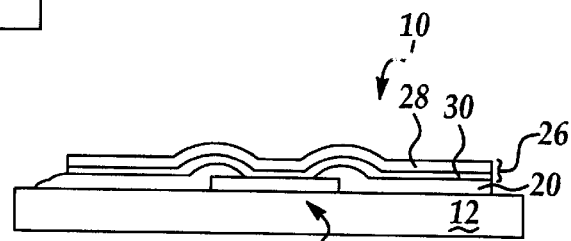
Figure 1C:
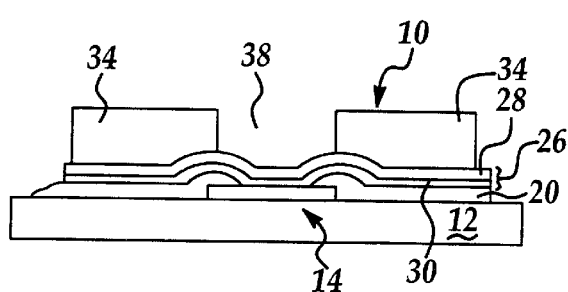
Figure 1D:
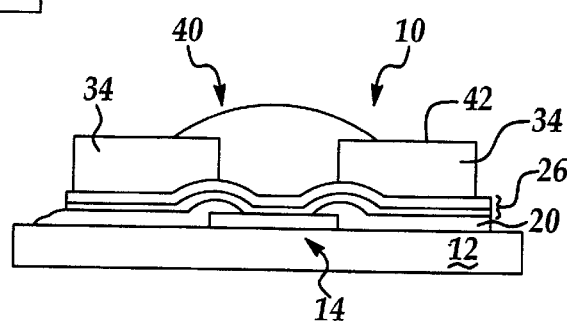
Figure 1E:
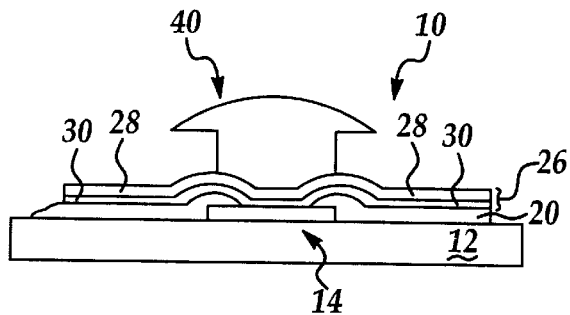
Figure 1F:
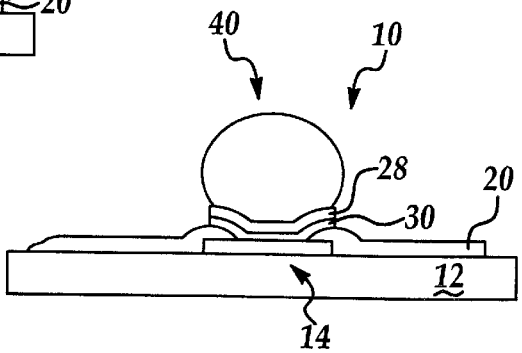
Figure 2A:
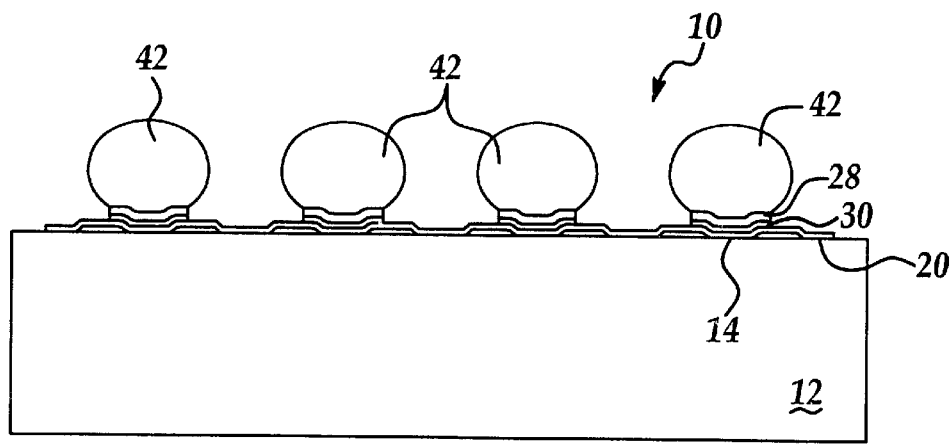
FIGS. 2A–2C are enlarged, cross-sectional views illustrating a conventional backlapping method for flip chip packages on a wafer utilizing a protective tape mounted on the solder balls.
Figure 2B:
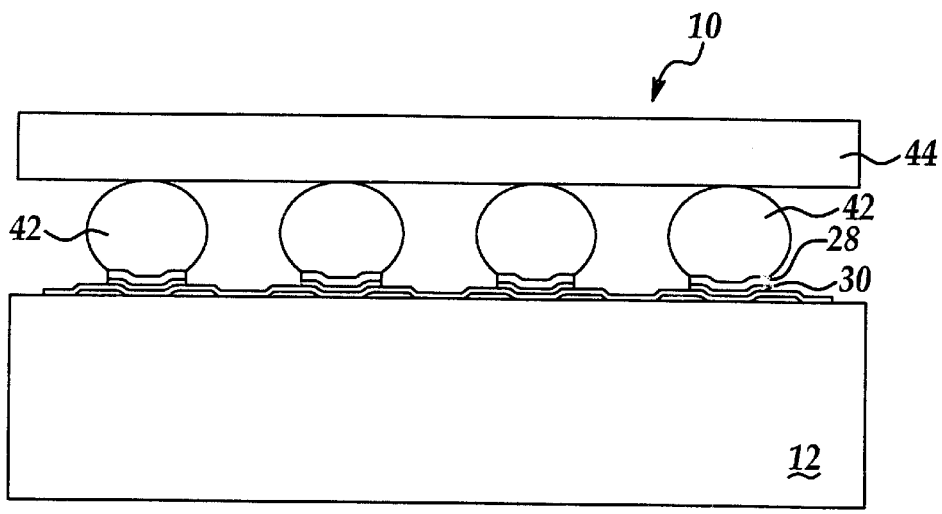
Figure 2C:
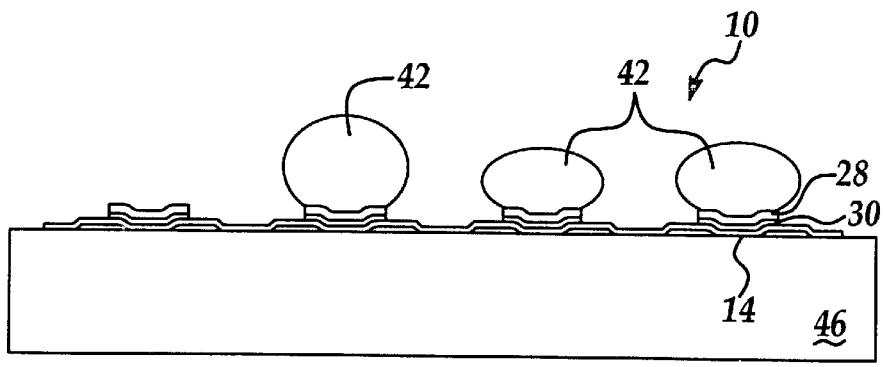
Figures 3, 4:
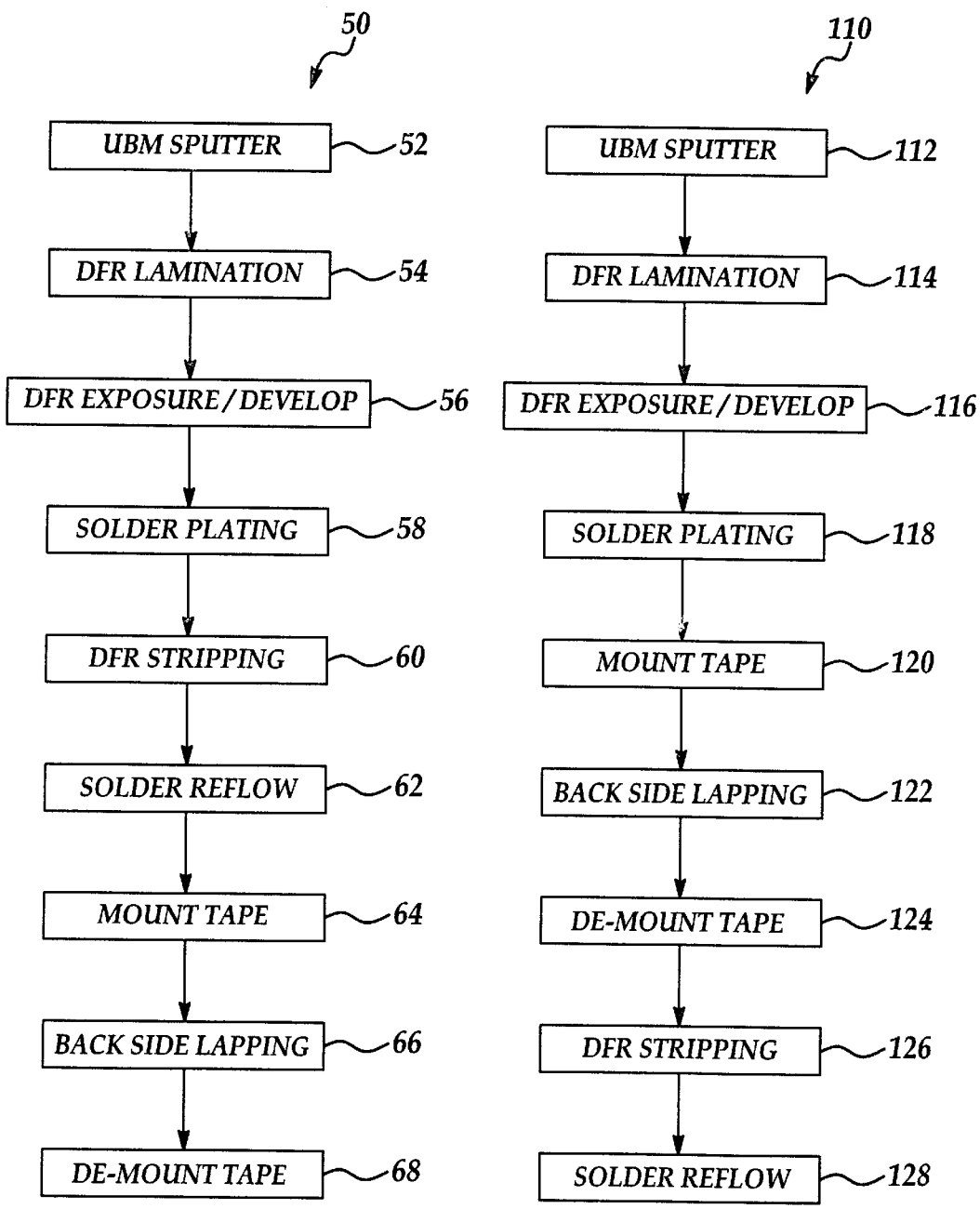
FIG. 3 is a process flow chart for the conventional backlapping process utilized for removing the backside of a wafer containing flip chip packages.
FIG. 4 is a process flow chart for the present invention method for removing a backside thickness from a wafer containing flip chip packages on an active surface.

The present invention novel method for bumping and backlapping a semiconductor wafer that has flip chip packages formed thereon is illustrated in a process flow chart in FIG. 4 and in enlarged, cross-sectional views in FIGS. 5A–5E.

Figure 5A:
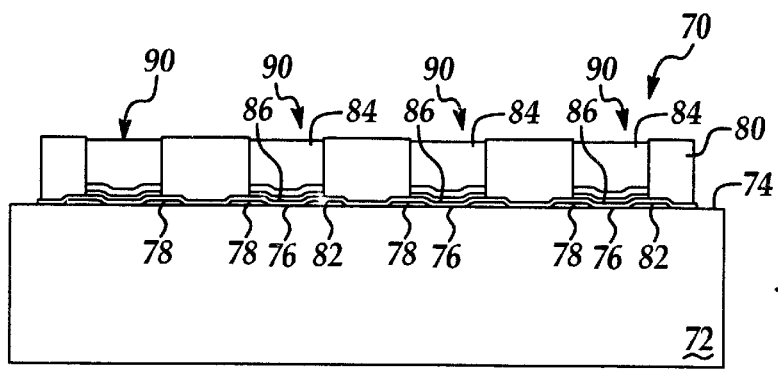
FIGS. 5A–5E are enlarged, cross-sectional views illustrating the present invention method for removing the backside of a wafer having solder bumps formed on an active side of the wafer and protected by a resist layer and a protective tape.

Referring now to FIG. 5A wherein a present invention semiconductor structure 70 is shown. The semiconductor structure 70 is built on a substrate 72 which has a substantial thickness, i.e. approximately 725 $\mu$m for a 300 mm wafer. On a top surface 74 of the semiconductor substrate 72 is provided a multiplicity of bond pads 76 which is insulated by a passivation layer 78. As shown in FIG. 5A, a UBM layer 82 is sputter deposited on top of the bond pads 76 before a dry film resist layer 80 is laminated to the semiconductor structure 70. After patterning and via opening by a photolithographic process, a multiplicity of openings 84 are formed. A diffusion barrier layer 86 and a copper seed layer 88 are then sequentially deposited into the openings 84, followed by filling the openings 84 with a solder material forming solder bumps 90 by either a stencil printing or an electroplating technique. These processing steps are substantially similar to that shown in the conventional method in FIGS. 1A–1D.

Figure 5B:
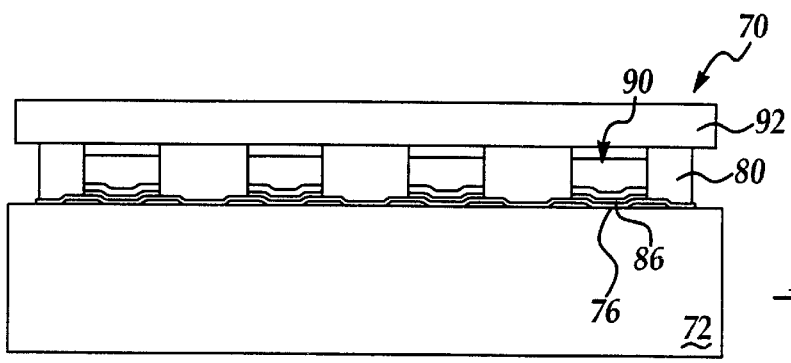

In the next step of the present invention method, a protective tape 92 is laminated onto the top of semiconductor structure 70, as shown in FIG. 5B. The protective tape 92 may be suitably formed of an insulating material, such as a polymeric material. The protective tape 92 may be coated on one side with an adhesive layer for easy mounting to the top surface of the photoresist layer 80.

Figure 5C:
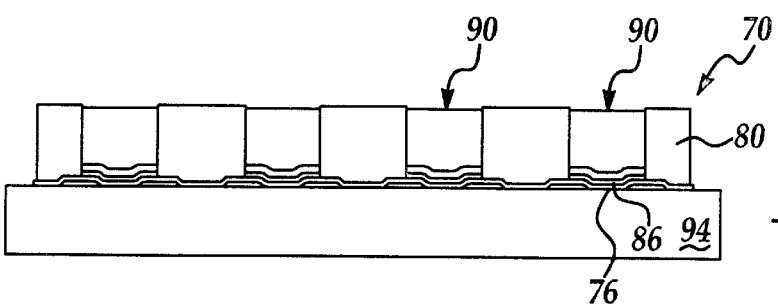

The semiconductor structure 70 with the protective tape 92 mounted on top is then flipped over and positioned in a lapping apparatus (not shown) such that the bottom surface 48 may be suitably removed. For instance, for a 300 mm wafer which has an initial thickness of about 725 $\mu$m, the substrate 72 is normally thinned down to a thickness of about 300 $\mu$m or less. A substantially thinned substrate 94, shown in FIG. 5C, is thus obtained. During the backlapping process, a suitable slurry is used in-between the substrate 72 and the polishing disc (not shown).

Figure 5D:
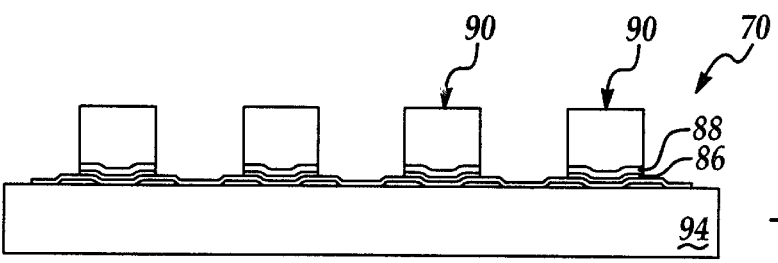

Further shown in FIG. 5C, the protective tape 92 is removed after the backlapping process is completed. The dry film resist layer 80 is then removed, as shown in FIG. 5D, and the semiconductor 70 is placed in a reflow furnace such that solder bumps 90 are reflown into solder balls 100. By utilizing the present invention novel method, any potential damages to the solder balls 100 can be effectively prevented.

The present invention novel method for bumping and backlapping a semiconductor wafer that is equipped with a multiplicity of solder bumps on an active surface of the wafer can further be illustrated in a process flow chart 110 shown in FIG. 4. The process is first started with a UBM sputtering step 112, a dry film resist lamination step 114, a dry film resist exposure/developing step 116, and a solder plating step 118. These steps are similar to steps 52–58 shown in FIG. 3 for the conventional method. However, the present invention novel method differs from the conventional method by step 118 wherein a protective tape is mounted to the semiconductor structure. After the backside lapping process is conducted in step 122, the protective tape may be removed in step 124, followed by the stripping of the dry film resist layer in step 126 and the solder reflow step 128. The present invention novel method therefore performs the backlapping process prior to solder bumps being reflown into solder balls and therefore, the solder bumps are protected by the dry film photoresist layer that acted as a mold for the solder bumps.

Figure 5E:
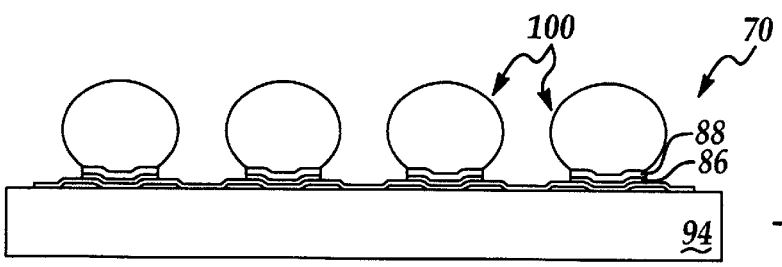

The present invention novel method for bumping and backlapping a semiconductor wafer that has a multiplicity of solder bumps formed on an active surface of the wafer has therefore been amply described in the above description and in the appended drawings of FIGS. 4–5E.

While the present invention has been described in an illustrative manner, it should be understood that the terminology used is intended to be in a nature of words of description rather than of limitation.

Furthermore, while the present invention has been described in terms of a preferred, it is to be appreciated that those skilled in the art will readily apply these teachings to other possible variations of the inventions.

The embodiment of the invention in which an exclusive property or privilege is claimed are defined as follows.

What is claimed is:

1. A method for bumping and backlapping a semiconductor wafer comprising the steps of:

providing a pre-processed wafer having a multiplicity of bond pads on a top surface;

depositing a under-bump-metallurgy (UBM) layer on said top surface of the wafer;

laminating a dry film resist layer on top of said UBM layer;

patterning said dry film resist layer with a multiplicity of openings exposing said multiplicity of bond pads;

depositing a solder into said multiplicity of openings forming a multiplicity of solder bumps;

mounting a protective tape on top of said dry film resist layer; and removing a preselected thickness from a bottom surface of said wafer.

2. A method for bumping and backlapping a semiconductor wafer according to claim 1 further comprising the step of reflowing said multiplicity of solder bumps to a multiplicity of solder balls after said removing step.

3. A method for bumping and backlapping a semiconductor wafer according to claim 1 further comprising the step of mounting said protective tape on top of said dry film resist layer by adhesive means.

4. A method for bumping and backlapping a semiconductor wafer according to claim 1 further comprising the step of providing said protective tape with an adhesive layer coated on one side.

5. A method for bumping and backlapping a semiconductor wafer according to claim 1 further comprising the step of mounting said wafer in a backlapping apparatus with the protective tape facing downwardly and the bottom surface of the wafer exposed.

6. A method for bumping and backlapping a semiconductor wafer according to claim 1 further comprising the step of removing at least 40% of the thickness of the wafer from said bottom surface of the wafer.

7. A method for bumping and backlapping a semiconductor wafer according to claim 1 further comprising the step of stripping said protective tape and said dry film resist layer sequentially from said top surface of the wafer after said removing step.

8. A method for bumping and backlapping a semiconductor wafer according to claim 1 further comprising the step of providing said protective tape in an insulating material.

9. A method for bumping and backlapping a semiconductor wafer according to claim 1 further comprising the step of depositing said solder into said multiplicity of openings by an electroplating technique.

10. A method for bumping and backlapping a semiconductor wafer according to claim 1 further comprising the step of depositing said solder. into said multiplicity of openings by a stencil printing technique.

11. a method for backlapping a semiconductor wafer having a multiplicity of solder bumps formed on an active surface comprising the steps of:

providing a semiconductor wafer having a multiplicity of solder bumps formed in a dry film photoresist layer;

mounting a protective film to a top surface of said dry film photoresist layer with an inactive surface of the wafer exposed; and removing a preselected thickness from said inactive surface of said wafer in a lapping process.

12. A method for backlapping a semiconductor wafer having a multiplicity of solder bumps formed on an active surface according to claim 11 further comprising the step of patterning said dry film photoresist layer with a multiplicity of openings exposing a multiplicity of bond pads prior to a solder filling step for forming said multiplicity of solder bumps.

13. A method for backlapping a semiconductor wafer having a multiplicity of solder bumps formed on an active surface according to claim 11 further comprising the step of stripping said protective film from said top surface of the dry film resist layer after said removing step.

14. A method for backlapping a semiconductor wafer having a multiplicity of solder bumps formed on an active surface according to claim 11 further comprising the step of stripping said protective film and said dry film resist layer sequentially from said active surface of the wafer.

15. A method for backlapping a semiconductor wafer having a multiplicity of solder bumps formed on an active surface according to claim 11 further comprising the step of removing at least 40% of the thickness of the wafer from said inactive surface of the wafer during said removing step.

16. A method for backlapping a semiconductor wafer having a multiplicity of solder bumps formed on an active surface according to claim 11 further comprising the step of reflowing said multiplicity of solder bumps into a multiplicity of solder balls after said stripping step.

17. A method for backlapping a semiconductor wafer having a multiplicity of solder bumps formed on an active surface according to claim 11 further comprising the step of removing a preselected thickness from said inactive surface of said wafer such that a final thickness of not more than 300 $\mu$m is obtained when said wafer is a 300 mm diameter wafer.

18. A method for backlapping a semiconductor wafer having a multiplicity of solder bumps formed on an active surface according to claim 11 further comprising the step of removing said preselected thickness from said inactive surface of the wafer in a lapping process by utilizing a slurry solution.

* * * * *